United States Patent [19]
Owen

[11] Patent Number: 5,345,188
[45] Date of Patent: Sep. 6, 1994

[54] SIGMA-DELTA DIGITAL FM DEMODULATOR

[75] Inventor: Jeffrey R. Owen, Portland, Oreg.

[73] Assignee: Seiko Telecommunication Systems, Inc., Beaverton, Oreg.

[21] Appl. No.: 92,381

[22] Filed: Jul. 14, 1993

[51] Int. Cl.⁵ .............................................. H03D 3/18
[52] U.S. Cl. ..................... 329/323; 329/336; 329/341; 329/343; 455/214; 455/337
[58] Field of Search ............... 329/323, 327, 336, 341, 329/343; 455/214, 337

[56] References Cited

U.S. PATENT DOCUMENTS

| | | | |
|---|---|---|---|
| 4,368,434 | 1/1983 | Miller et al. | 329/336 |
| 4,707,666 | 11/1987 | Pfeifer et al. | 455/214 X |
| 5,077,538 | 12/1991 | Gehrt et al. | 455/214 X |

OTHER PUBLICATIONS

Two articles entitled "A Use of Limit Cycle Oscillations to Obtain Robust Analog-to-Digital Converters'-'and Table-Based Simulation of Delta-Sigma Modulators. Both articles are located in a manual entitled Oversampling Delta-Sigma Data Converters published by the Institute of Electrical and Electronics Engineers, Inc. in 1992 pp. 44-51, 163-167.

Primary Examiner—Siegfried H. Grimm
Attorney, Agent, or Firm—Elmer Galbi

[57] ABSTRACT

Digital frequency demodulation is accomplished by monitoring similar transitions in an FM radio signal to determine frequency. Time intervals between similar transitions in the FM signal are established by selecting anticipated transition times and accumulating error values relative to actual transition times. Accumulated error values provide a basis for further selecting anticipated transition times in such manner that a reported sequence of anticipated transition times provides a basis for inferring signal frequency. In one illustrated embodiment, the chosen transition times are positive transitions in the FM signal and the anticipated times of transition are taken from a set of two time periods, an early transition and a late transition relative to a valid transition window. By reporting the selected anticipation times by associated values in a digital bit stream, frequency may be inferred by computing a ratio of given digital values in the bit stream relative to the total number of samples in the bit stream.

18 Claims, 8 Drawing Sheets

SIGMA-DELTA DIGITAL FM DEMODULATOR

BACKGROUND OF THE INVENTION

Frequency modulated (FM) radio signals are well known and have been widely used for audio broadcasts, and more recently used for data broadcasts. For example, common RCC POCSAG and a paging system employing FM radio broadcast subcarriers and small power efficient receiving paging devices, e.g., wristwatch paging devices, have been successfully implemented. Use of such devices to capture and demodulate the FM radio signal has required considerable analog circuitry.

Conventional analog circuits used for FM demodulation include phase or frequency locked loops and many varieties of discriminator circuits. FM demodulation has also been conducted by use of hybrid digital-analog circuits such as pulse count demodulators and application of a digitized intermediate frequency (IF) signal to a digital FM demodulator. Generally, analog based FM demodulation suffers from large physical size requirements and digital based FM demodulation requires very high speed analog-to-digital conversion or extremely high clock speeds.

Analog demodulation of FM radio signals carries with it many of the difficulties inherent in analog circuitry. Implementation in integrated circuitry requires extensive external, i.e., off-chip, components or use of massive integrated circuit resources to implement analog devices. Also, analog circuits implemented on large multi-function integrated circuits are especially susceptible to noise or interference from other circuitry on the integrated circuit chip. Most analog demodulators require resonators provided as large off-chip components. Finally, most FM demodulation implementations, due to relatively large size, are difficult to miniaturize especially in a small paging device such as a wristwatch paging device.

FM demodulation can be divided generally into five categories: discriminator circuits with linear filters followed by envelope detectors, frequency and phase lock loops, pulse count demodulators, high speed counter demodulators, and conversion of analog IF signals to digital signals followed by digital FM demodulation. Discriminator circuits are physically large and sometimes require specific tuning. Also, if the demodulated signal is to be digitally processed, then an analog-to-digital conversion block is required. Frequency and phase lock loops require relatively large off-chip components, e.g., capacitors, and are not generally easy to implement in integrated circuitry. If the demodulated signal is to be digitally processed, then an analog-to-digital conversion block is required. Also, VCO linearity typically affects demodulation distortion. Pulse count demodulators typically employ a triggered one-shot circuit and require large off-chip components, e.g., capacitors. Such pulse count demodulators are generally applicable only to very wide band FM signals. A high speed counter-based demodulator can measure a time differential between given transitions in the FM signal, however, such timing measurement requires an extremely fast counter, i.e., driven by a very high speed clock, and requires relatively large power input and heat dissipation. Conversion of analog IF signals to digital signals followed by digital FM demodulation generally requires very high speed analog-to-digital conversion and relatively high speed digital signal processing to accomplish digital demodulation.

As may be appreciated, minimizing use of analog circuitry in an FM demodulator reduces the above-noted problems inherent in analog circuitry. Also, if an FM signal is to be ultimately applied to a digital application, such as in a paging device, it is desirable to accomplish analog-to-digital conversion at the time of demodulation, however, no such FM demodulators are presently available. Reducing such problems is generally desirable for any FM demodulator, but can be especially important in the context of small radio signal receiving devices such as wristwatch based paging devices where size and performance, i.e., data integrity and power consumption, are critical requirements. To the extent that the FM demodulator can be implemented digitally and in digital integrated circuitry, the product is improved with respect to noise immunity, overall packaging, and design versatility.

SUMMARY OF THE INVENTION

In accordance with the present invention, digital frequency demodulation is accomplished by monitoring chosen transitions of an FM signal; selecting, based on an accumulated error value, one of a plurality of anticipated times between adjacent chosen signal transitions; measuring the difference between the actual transition time and the selected anticipated time; and incorporating this difference into an accumulated error value. The frequency of the signal is inferred by the series of selected anticipated times generated. If the rate of selection of anticipated times is greater than the bandwidth of the modulating signal, then the incorporation of the individual differences into an accumulated error can be done in such a manner so as to spectrally shape the majority of the quantization noise outside the frequency range of the modulating signal, where it is easily removed by digital filtering.

In one preferred form of the present invention, the chosen transitions of the FM signal chosen for monitoring are all consecutive positive going transitions, i.e., consecutive rising edges in an associated intermediate frequency (IF) signal. The time differential between such chosen transitions provides a basis for inferring frequency of the FM signal. The anticipated transition times are taken from a set of two possible selections, an early selection and a late selection. The early selection is associated with a digital value "one" and the late selection is associated with a digital value "zero." For each selected anticipated time of transition, the associated digital value is reported, i.e., for each early selection a digital "one" is reported and for each late selection a digital "zero" is reported. The early selection is slightly less than the earliest next valid chosen transition and the late selection is slightly greater than the latest next valid chosen transition in the FM signal. Thus, choosing the early anticipated transition time always produces a negative error, and choosing the late transition time always produces a positive error. The accumulated error is the summation of all past errors, i.e., past differences between the actual times of the chosen transition and the selected anticipated times. Choosing the early anticipated time whenever the accumulated error is greater than zero and choosing the late anticipated time otherwise establishes negative feedback and assures an accumulated error value within given limits. The frequency of the signal is inferred from the ratio of reported "ones" to the total number of reported "ones" and "zeros."

The subject matter of the present invention is particularly pointed out and distinctly claimed in the concluding portion of this specification. However, both the organization and method of operation of the invention, together with further advantages and objects thereof, may best be understood by reference to the following description taken with the accompanying drawings wherein like reference characters refer to like elements.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION OF THE PREFERRED EMBODIMENT

Figure 1:
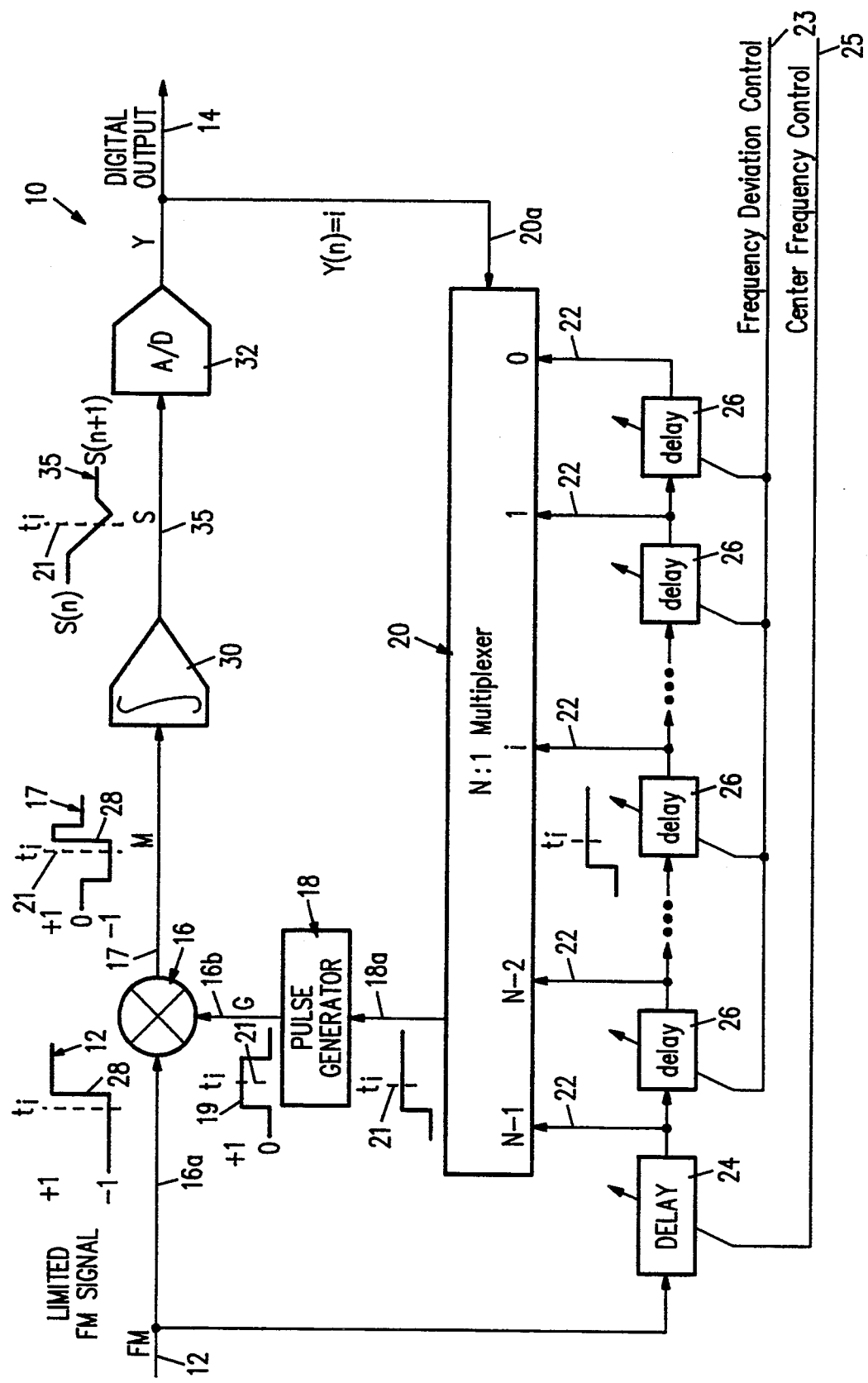
FIG. 1 is a block diagram of a sigma-delta digital FM demodulator according to the present invention.

The preferred embodiment of the invention as illustrated in the drawings comprises generally a device receiving a frequency modulated signal and providing measurement of frequency in that signal for information recovery therefrom. Frequency information is recovered generally by measuring a time differential between similar adjacent transitions in the FM signal. The relatively low-power device advantageously delivers digital frequency data, thereby avoiding need for a separate analog-to-digital conversion block in applications where data is to be later digitally processed. Because the device is primarily digital in nature, many of the disadvantages associated with prior analog FM demodulation are avoided. Furthermore, the device in its preferred form is particularly well suited for implementation in miniaturized power-efficient devices, such as small paging devices operating according to FM radio signal data broadcast.

Figure 2:
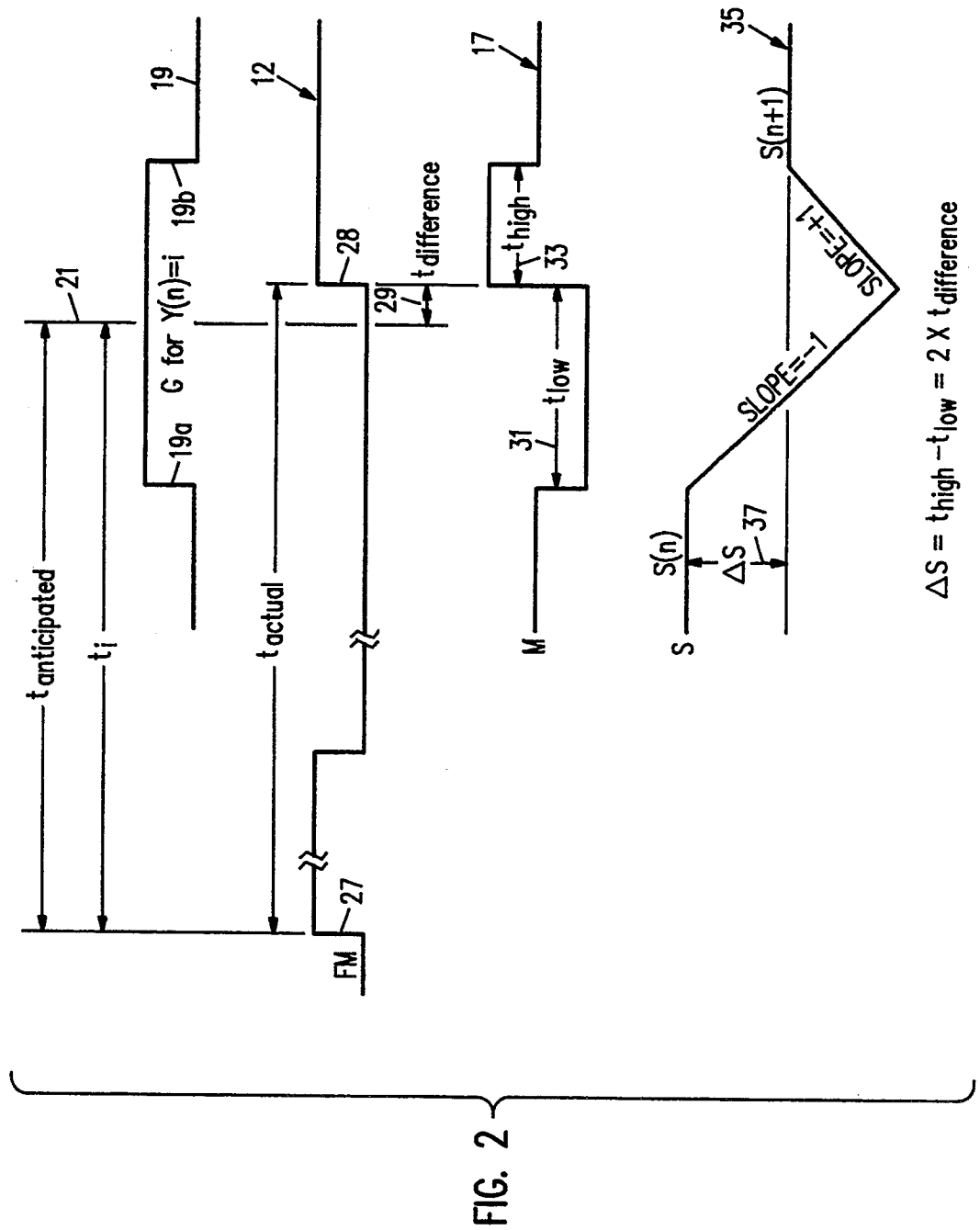
FIG. 2 is a timing diagram illustrating operation of the sigma-delta digital FM demodulator of FIG. 1.

FIG. 1 illustrates in block form the general arrangement of a sigma-delta digital FM demodulator according to the present invention. FIG. 2 is a timing diagram illustrating an FM signal processed by the demodulator of FIG. 1 and various signals developed by the demodulator of FIG. 1 during demodulation in accordance with the present invention.

In FIGS. 1 and 2, sigma-delta FM digital demodulator 10 receives a limited FM signal 12 and provides a digital output 14. FM signal 12 is a limited FM signal, i.e., a square wave, having amplitude variation between, for example, negative one and positive one volt. Transitions in the FM signal 12 represent frequency of the FM signal 12. For example, FM signal 12 can be derived from an FM radio signal broadcast and converted to an intermediate frequency (IF) signal for demodulation as is typically done in conventional FM radio signal processing. As explained more fully hereafter, digital output 14 represents the frequency of FM signal 12, the frequency information being later recovered by further analysis of digital output 14.

Demodulator 10 includes a digital multiplier 16 receiving at a first input 16a the limited FM signal 12 and at a second input 16b a gate signal 19, also designated G herein, from a pulse generator 18. Pulse generator 18 produces its gate signal 19 as a single pulse going from zero volt to positive one volt for a given pulse duration. Pulse generator 18 provides the gate signal 19 in selected delayed response to a first actual transition 27 (FIG. 2) in the limited FM signal 12. The center of the pulse in gate signal 19 represents an anticipated next transition 21, also indicated as the time $t_i$, in the FM signal 12 for a next actual transition 28. The time differential 29 between the time of the anticipated next transition 21 and the actual next transition 28 represents an error with respect to the selected anticipated next transition 21.

Pulse generator 18 is triggered at its trigger input 18a by the output of a multiplexer 20. For an N:1 multiplexer, N trigger signals 22 are applied to the inputs of multiplexer 20. Each of the trigger signals 22 is offset in time by a given magnitude small delay $t_{delay}$ from the previous trigger signal 22. The FM signal 12 is applied to a first adjustable delay block 24 providing a large delay $t_{DELAY}$ and then applied in series to a sequence of smaller adjustable delay blocks 26 each providing a small delay $t_{delay}$. Adjustment in large delay $t_{DELAY}$ as provided by delay block 24 is provided by a center frequency control signal 25. Adjustment in the small delay $t_{delay}$ is provided by a frequency deviation control signal 23 applied in common to each of the delay blocks 26.

For a bandwidth limited FM signal, adjacent similar transitions, e.g., rising edges, in the FM signal 12 occur within a given window of valid next transitions. The delay $t_{DELAY}$ of block 24 is of magnitude corresponding to the time differential between a given transition in the FM signal 12, e.g., actual transition 27 (FIG. 2), and the beginning of this window of next valid transition, e.g., the window in which next actual transition 28 occurs, less half the duration of the gate signal pulse. The output of delay block 24 is applied to the high order input, i.e., input N−1, of multiplexer 20 as the most early trigger signal 22, and also to the first delay block 26. Each subsequent delay block 26 applies its output as one of the trigger signals 22 to the next input of the multiplexer 20 and also to the downstream next delay block 26.

Thus, a series of trigger signals 22 offset in time by the delay $t_{delay}$ are made available at the inputs of the multiplexer 20. Each trigger signal 22 is a function of a prior transition in the FM signal 12, i.e., actual transition 27, and represents an anticipated time of next actual transition, i.e., transition 28. Thus, N anticipated times of next transition are made available. By selecting one of the trigger signals 22 for application to the pulse generator 18, i.e., by appropriately addressing multiplexer 20 at its address input 20a, the gate signal 19 is applied to the multiplier 16 as a selected anticipated next transition 21. Selection among the trigger signals, i.e., addressing of multiplexer 20, is a function of the digital output 14 in the previous processing cycle.

The multiplier output 17, also designated M, varies between three states, i.e., negative one volt, zero volt, and positive one volt, according to multiplication of the FM signal 12 and the gate signal 19. Outside the pulse provided in the gate signal 19, i.e., before and after the pulse, multiplier output 17 remains at zero volt. During the pulse provided in the gate signal 19, however, the state of multiplier output 17 follows the state of FM signal 12. In particular, at the rising edge 19a of gate signal 19 the multiplier output 17 goes to negative one volt for a time period 31 (FIG. 2), also designated $t_{low}$. At the actual next transition 28 in the FM signal 12, however, multiplier output 17 goes to positive one volt for a time period 33 (FIG. 2), also designated $t_{high}$, concluding with the falling edge 19b of the gate signal 19. The time differential 29 corresponds to the difference between time periods 31 and 33, i.e., the half difference between $t_{low}$ and $t_{high}$. If the anticipated next transition 21, i.e., the center of the pulse provided in gate signal 19, is coincident with the actual next transition 28 then the time periods 31 and 33 are equal. Otherwise, the difference between time periods 31 and 33 corresponds to an error in the anticipated next transition 21 relative to the actual next transition 28.

Application of the multiplier output 17 to an integrator 30 generates representation of errors in the anticipated next transition 21 relative to the actual next transition 28, and further accumulates such errors over time. For example, if the time of the anticipated next transition 21 were exactly correct, integrator 30 integrates a negative one volt signal for the same period of time it integrates a positive one volt signal with a net accumulation of no error, i.e., delta S difference 37 equals zero. As the anticipated next transition 21 deviates from the actual next transition 28, however, integrator 30 integrates one of a positive or a negative voltage for a relatively greater time and thereby accounts for the error in the anticipated transition 21, i.e., measures the time differential 29. Integrator 30 continuously integrates the multiplier output 17 throughout operation of the demodulator 10. By selecting each anticipated next transition 21 under negative feedback, the integrator output 35, also designated S, remains within a given range.

In the illustrated example of FIGS. 1 and 2, i.e., where the anticipated transition 21 is slightly ahead of the next transition 28, the integrator output S 35, i.e., the overall accumulated error following the current cycle S(n+1) is more negative than the integrator output following the previous cycle S(n). An early anticipated transition 21 results in a more negative accumulated error, i.e., a more negative integrator output 35. Similarly, a late anticipated transition 21 results in a more positive accumulated error, i.e., a more positive integrator output 35. Thus, as illustrated in FIG. 2, the integrator 30 during the $t_{low}$ time period 31 will integrate a negative voltage and its output 35 will follow a $-1$ slope. During the $t_{high}$ time period 33, when it receives a positive voltage, integrator output 35 follows a $+1$ slope. The delta S difference 37 in integrator output 35 from one cycle to the next, i.e., the difference between output S(n+1) and output S(n), corresponds to the error in the most recent anticipated next transition 21 relative to the actual next transition 28. As may be appreciated, if the anticipated next transition 21 is coincident with the actual next transition 28, then integrator 30 will integrate a positive voltage for as long as it integrates a negative voltage with no net change in the integrator output 35, i.e., S(n+1) equals S(n). Otherwise, the change in integrator output represents an error in the anticipated next transition 21, and the current state of integrator output 35 represents overall accumulated errors for all past anticipated next transitions 21.

The integrator output 35, i.e., the overall accumulated error in time of anticipated transitions 21 relative to time of corresponding actual transitions 28, is applied to an analog-to-digital block 32. Analog-to-digital block output, also designated Y, is the digital output 14. By applying the digital output 14 to the address input 20a of multiplexer 20, the accumulated error, i.e., the integrator 30 output 35, is maintained within a given range by negative feedback. As the accumulated error moves in a given direction, the multiplexer 30 appropriately selects one of the trigger signals 22 to move when necessary the accumulated error in the opposite direction. Overall, the accumulated error represented in the integrator output 14 remains within a given range as a result of such negative feedback.

The digital output 14 is further analyzed to derive useful frequency information. Such further analysis can simply be that of averaging groups of values in the stream of digital output 14. The average value through a given time period represents the average frequency of the FM signal 12 during that period. Thus, digital output 14 could be applied to a next processing block (not shown in FIG. 1) averaging groups of values in digital output 14 and providing frequency information representing information carried in the FM signal 12. More particularly, the illustrated digital output 14 can vary between zero and $N-1$. Each value appearing in the digital output 14 corresponds to a transition location within the window of valid next transitions in the FM signal 12. The average value of a group of values appearing in digital output 14 over a given time interval provides a basis for identifying a location in the window of valid next transitions, and therefore a basis for computing average frequency for the given time interval.

Center frequency control signal 25 and frequency deviation control signal 23 operate dynamically to maintain appropriate adjustment in the delay elements 24 and 26. More particularly, upon start up the frequency deviation control signal 23 is set to maximum delay and the center frequency control signal 25 is set to a mid-point delay. A negative feedback loop is then executed to adjust the center frequency control signal 25 until the digital output 14 averages one half of $N-1$. Overall, it is assumed that the average occurrence for actual next transitions 28 is the center of the window of valid next transitions in FM signal 12. Based on this assumption, adjusting center frequency control signal 25 until the digital output averages one half of $N-1$ insures that the group of available anticipated transition times are well centered about the window of valid next transitions in the FM signal 12. This negative feedback control loop for the center frequency control signal 25 remains in operation during use of the sigma-delta digital FM demodulator 10.

After the center frequency control signal is adjusted as described above, the frequency deviation control signal 23 is modified. In particular, frequency deviation control signal 23 is adjusted to fill a good portion of the full scale of values appearing in digital output 14. Thus, frequency deviation control signal 23 is adjusted until the digital output 14 covers a large range of values, e.g., ⅞ of full scale. In FM broadcast receiver implementations where audio signals vary widely and a stereo pilot signal is present, the frequency deviation control signal 23 may be adjusted until the pilot peak amplitude is approximately 6% of full scale thereby allowing total FM deviation of approximately 150% for a 9% pilot signal.

The above described FM demodulator 10 is set forth in general terms and could be implemented in a large scale digital circuit wherein the digital output 14 is at a given resolution, i.e., number of bits in each value presented, and a given size of multiplexer 20, i.e., selection among a large number of possible trigger signals 22 very closely spaced in time. As may be appreciated, the greater the resolution in digital output 14 and the larger the number of trigger signals 22 the more accurate the FM demodulation. Greater processing overhead, circuit resources and component tolerances are required for such accuracy and resolution. The invention can be implemented, however, on a much smaller scale while still providing meaningful frequency information. For example, small scale A-to-D conversion, e.g., 2-bit flash convertors, may be used in a relatively small scale implementation of the present invention. Thus, while the sigma-delta FM demodulator described herein can be implemented at higher resolution and complexity, such implementations may be of considerable size and may not be justified in light of alternative FM demodulation methods and devices available. For smaller scale implementations, however, the FM demodulator of the present invention can be an effective solution to FM demodulation in a miniaturized FM signal receiver.

The FM demodulator of the present invention is particularly well suited for very small scale implementations, e.g., such as in miniaturized FM radio signal receiving devices serving as wristwatch paging devices responsive to FM radio signal data broadcast. The remaining description and drawings illustrate a small scale implementation of the present invention, however, it will be understood that the present invention is not limited to such small scale implementations. More particularly, the remaining description will focus on a single bit digital output and selection among only two anticipated next transitions 21.

Figure 3:
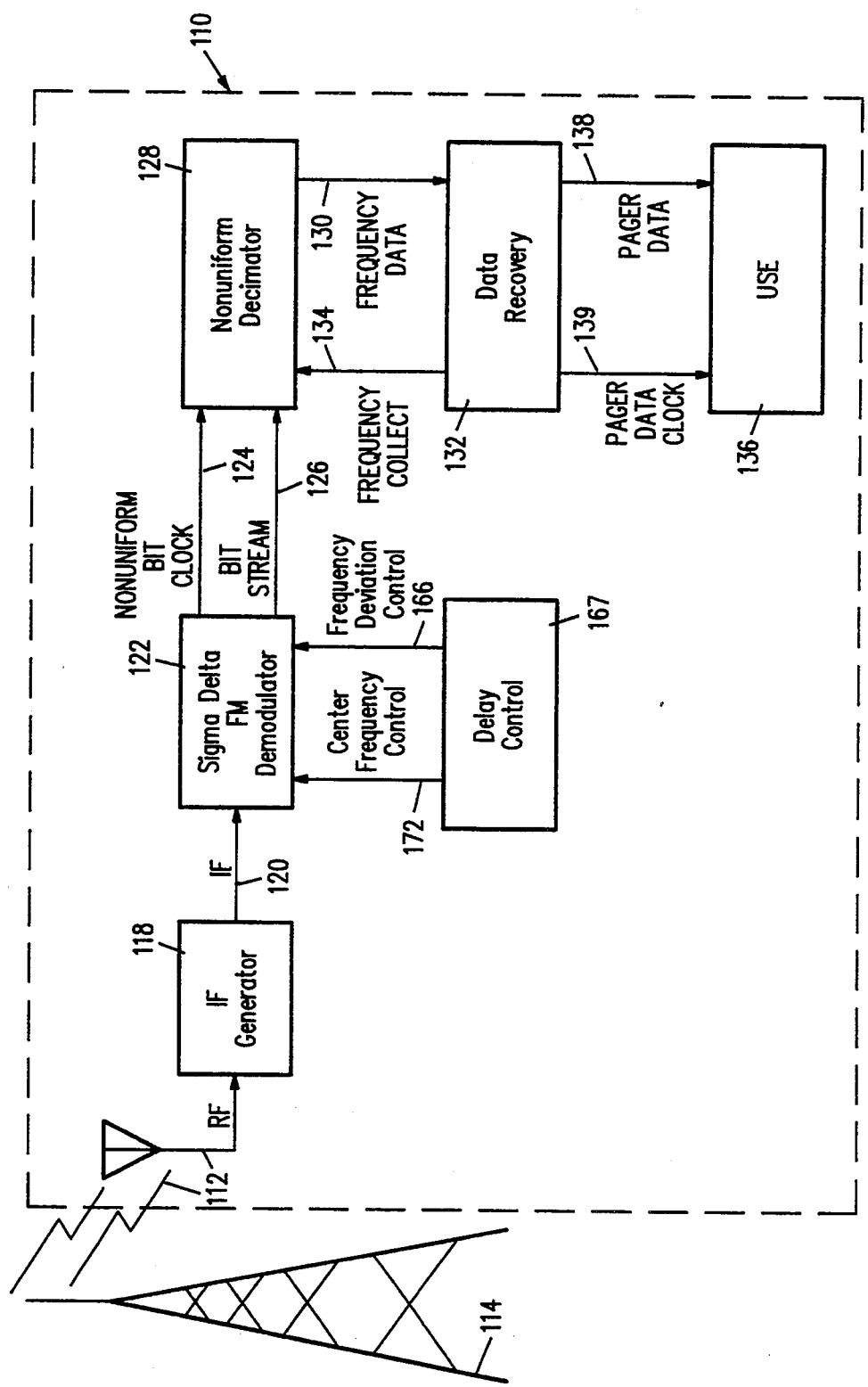
FIG. 3 is a block diagram of an FM radio signal receiving device including a sigma-delta digital FM demodulator in accordance with the present invention.

In FIG. 3, radio receiving device 110 collects an FM radio signal 112 as provided by FM radio signal source 114. For example, radio receiving device 110 might be a paging device with the FM radio signal 112 providing paging data collected, developed and broadcast by a paging system serving as the FM radio signal source 114. While the present invention will be described and illustrated in the context of a paging system, it will be understood that the present invention has applications beyond that of paging devices.

The FM radio signal 112 is first processed by the radio receiving device 110 in an intermediate frequency (IF) generator 118. Generator 118 corresponds to a conventional FM receiver up to, but not including, the discriminator circuit. As will be appreciated by those skilled in the art, IF signal 120 is a square wave signal corresponding in frequency to that of the FM radio signal 112, but mixed to the intermediate frequency and amplified until limiting occurs, thereby producing a signal with two amplitude values and transitions occurring at a fairly uniform rate according to signal frequency. Thus, the frequency of IF signal 120 is a function of the frequency of the FM radio signal 112, and provides a basis for FM demodulation. The IF signal 120 produced by IF generator 118 is applied to a sigma-delta digital FM demodulator 122 of the present invention.

The sigma-delta FM digital demodulator 122, described in more detail hereafter, produces a signal 120 frequency dependent, i.e., non-uniform, sample or bit clock signal 124 and a bit stream 126. The bit stream 126 provides a sequence of logic values, i.e., ones and zeros, and the sample clock 124 provides a basis for sampling values from the bit stream 126. A non-uniform decimator block 128 receives the non-uniform clock 124 and bit stream 126 and, based on the proportion of ones and zeros in bit stream 126, provides frequency data 130 to a data recovery block 132 upon activation of a uniform frequency collect signal 134. Data recovery block 132 uses conventional uniform sampling according to known digital signal processing (DSP) techniques to filter and recover a pager data stream 138 and a pager bit clock 139. A use block 136, which constitutes the bulk of the radio receiving device 110, interprets the pager data 138 and pager data bit clock 139 according to a given data protocol, and displays the paging messages according to a given user interface.

Figure 4:
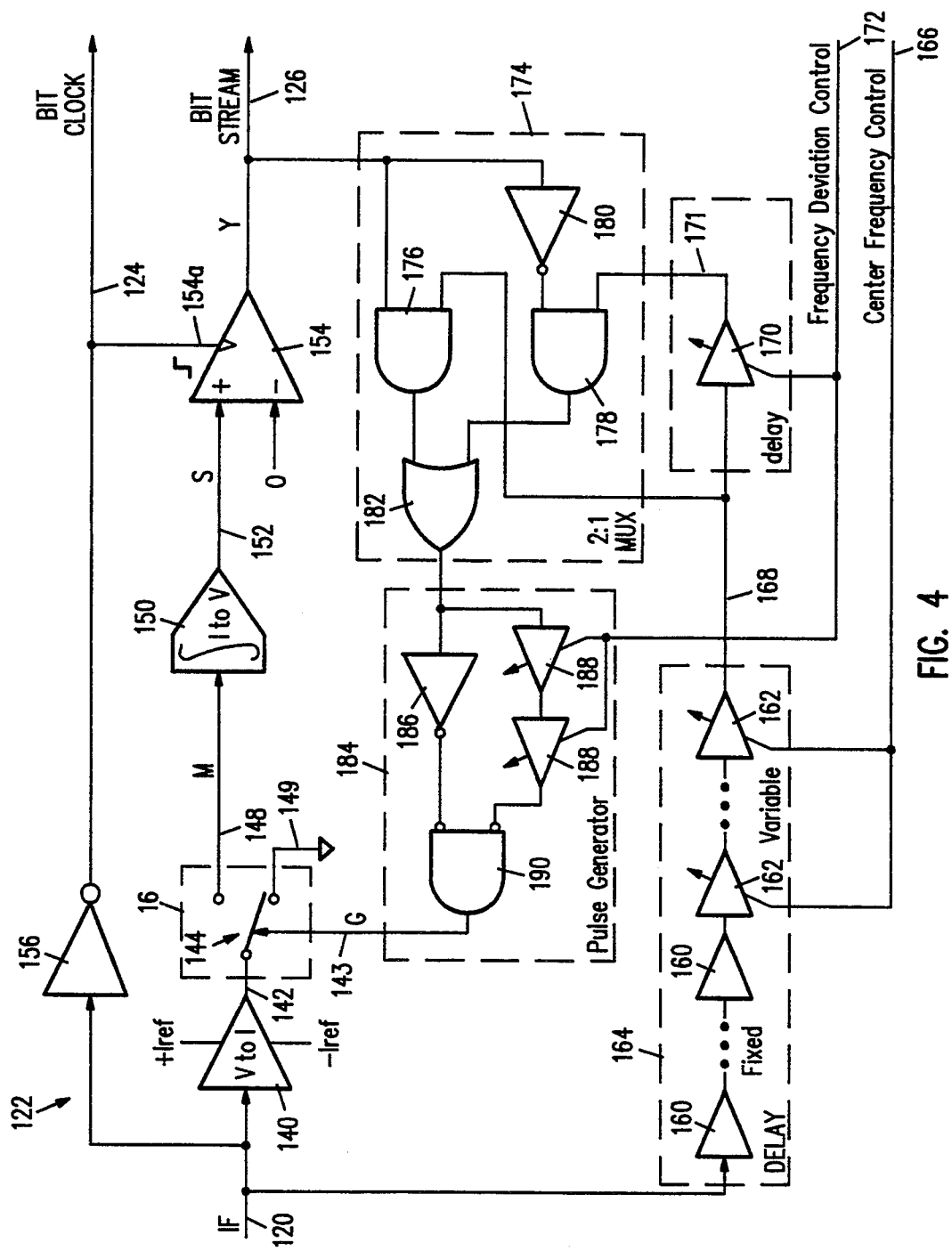
FIG. 4 is a block diagram illustrating in more detail the FM digital demodulator of FIG. 3.

FIG. 4 illustrates in more detail the digital demodulator 122. In FIG. 4, a voltage-to-current convertor 140 receives the IF signal 120 and produces an IF current signal 142. As may be appreciated, convertor 140 receives a positive and negative current reference, i.e., $+I_{ref}$ and $-I_{ref}$, and the IF current signal 142 moves between current values at positive $I_{ref}$ and negative $I_{ref}$ according to the state of the IF signal 120. More particularly, if the IF signal 120 is at logic one then the IF current signal 142 presents a positive $I_{ref}$ current as the IF current signal 142. Similarly, if the IF signal 120 is at logic zero then the IF current signal 142 presents a negative $I_{ref}$ signal as the IF current signal 142.

The IF current signal 142 is applied to the common node of FET switch 144. FET switch 144 corresponds to the multiplier 16 of FIG. 1. Under control of a gate signal 143, also designated G, the current signal 142 passes through switch 144 as a gated IF current signal 148, also designated M, or passes to an electronic ground 149. More particularly, if the gate signal 143 is low then the current signal 142 passes to ground 149 and gated IF current signal 148 is zero. If gate signal 143 is high then the current signal 142 passes through switch 144 as the gated IF current signal 148. Thus, gated IF current signal 148 has three states, zero if gate signal 143 is low, negative $I_{ref}$ if gate signal 143 is high and IF signal 120 is low, and positive $I_{ref}$ if gate signal 143 is high and IF signal 120 is high. As used herein, the terms "high" and "low" refer to logic value one and logic value zero, respectively.

Current integrator 150, providing a voltage output, continuously integrates the gated IF current signal 148 and provides an integrator voltage output 152, also designated S. The integrator output 152 represents an accumulated error value relative to selected anticipated times of transition in the IF signal 120 and actual transition times in the IF signal 120.

The integrator output 152 is applied to the positive terminal of a clocked comparator 154. The comparator 154 responds to the bit clock 124, i.e., performs its comparison function in response to transitions in bit clock 124. Bit clock 124 is an inverted form of IF signal 120, i.e., provided by means of an inverter 156. The negative terminal of comparator 154 receives a zero volt reference. Thus, comparator 154 determines the sign, i.e., positive or negative, of the integrator output 152 in response to the sample clock signal 124. Comparator 154 provides as its output the bit stream 126 where a value "one" represents a positive accumulated error and a value "zero" represents a negative accumulated error.

As explained more fully hereafter, frequency of the IF signal 120 is determined by monitoring positive going transitions, i.e., rising edges, in the IF signal 120. The comparator 154 responds to a rising edge at its clock input. To insure that comparator 154 performs its comparison when the gate signal 143 is low and when the integrator output 152 is stable, comparator 150 is clocked during negative going transitions, i.e., falling edges, in the IF signal 120. The IF signal 120 is applied, therefore, to inverter 156 and the output of inverter 156 is applied to the rising edge clock input 154a of comparator 154. Also, the output of inverter 156 serves as the sample clock signal 124 whereby falling edges in clock 124 correspond to sample points in the bit stream 126.

The output of comparator 154, i.e., the bit stream 126, selects one of two anticipated next transition times for application to the FET switch 144 in the form of a pulse of given width and timing relative to the previous actual transition in the IF signal 120. As described earlier, the center point of this pulse represents a selected anticipated next transition time in the IF signal 120. The pulses are produced by delaying the IF signal 120.

The IF signal 120 is applied to a first series of fixed delay gates 160. A second series of adjustable delay gates 162 completes a delay circuit block 164. The delay gates 162 receive in common the center frequency control signal 166. The function of delay block 164 is to provide a delay approximately equal to the time between a given transition in the IF signal 120 and the beginning of the window of valid next transitions in the IF signal 120 less half the gate pulse duration. The output 168 of delay block 164 is applied to a variable delay element 170, providing a delay on the order of $t_{delay}$, i.e., equal to or slightly greater than the window 208 of valid next transitions. The frequency deviation control signal 172 is applied to the delay element 170 for adjustment in the delay provided thereby.

A 2:1 multiplexer 174 receives the delay block output 168 and the output 171 of adjustable delay element 170. More particularly, AND gates 176 and 178 receive at respective first inputs thereof the delay block output 168 and the output 171 of delay element 170. The second input of AND gate 176 receives the bit stream 126. The second input of AND gate 178 receives an inverted form of the bit stream 126 by way of inverter 180. The outputs of AND gates 176 and 178 are applied to respective inputs of OR gate 182. The output of OR gate 182 serves as the output of the multiplexer 174. Thus, multiplexer 174 receives an early trigger in the form of delay block output 168 and a late trigger in the form of delay element 170 output 171. Multiplexer 174 selects among the two trigger events based on the state of bit stream 126. As may be appreciated, the early trigger from delay block output 168 produces an early gate G1 in the gate signal 143 and the late trigger originating from delay element 170 output 171 produces a late gate G0 in the gate signal 143. The early gate G1 precedes the late gate G0 by a time interval $t_{delay}$ as provided by the delay of delay element 170. It should be understood, however, that the early gate G1 and late gate G0 are not produced concurrently.

A pulse generator block 184 receives the output of OR gate 182, i.e., the selected gate trigger signal provided by multiplexer 174, at an inverter 186 and at the input of a first one of a series of two delay elements 188, each providing a delay on the order of $t_{delay}$ and receiving in common the frequency deviation control signal 172. The output of inverter 186 and that of the last delay element 188 are applied to the inverted inputs of an AND gate 190. The output of AND gate 190 is the gate signal 143. Thus, upon presentation of a rising edge from multiplexer 174, pulse generator 184 produces a pulse, i.e., an early gate G1 or a late gate G0, in the gate signal 143 corresponding in duration to the delay provided by the delay elements 188, i.e., a delay of two time intervals $t_{delay}$.

The output of the comparator 154, i.e., the bit stream 126, selects by means of logic gates 176, 178, 180, and 182 which of the two gate signals G1 or G0 will appear as a pulse in the gate signal 143 for operation of FET switch 144. Thus, if bit stream 126 is, at a given point, high then AND gate 176 will allow an early trigger and an early gate signal G1 results. If, however, bit stream 126 is low then AND gate 176 is disabled and AND gate 178 is enabled whereby a late trigger is allowed and a late gate signal G0 results. The resulting early gate G1 or late gate G0, i.e., pulses in the gate signal 143, are of the same duration but offset by one-half the pulse duration whereby the center point of the early pulse (G1) corresponds in time offset to the rising edge of the late pulse (G0) and the falling edge of the early pulse (G1) corresponds in time offset to the center point of the late pulse (G0). The center of each pulse represents a selectable anticipated time of a next rising edge in the IF signal 120 relative to the previous rising edge.

Figure 5:
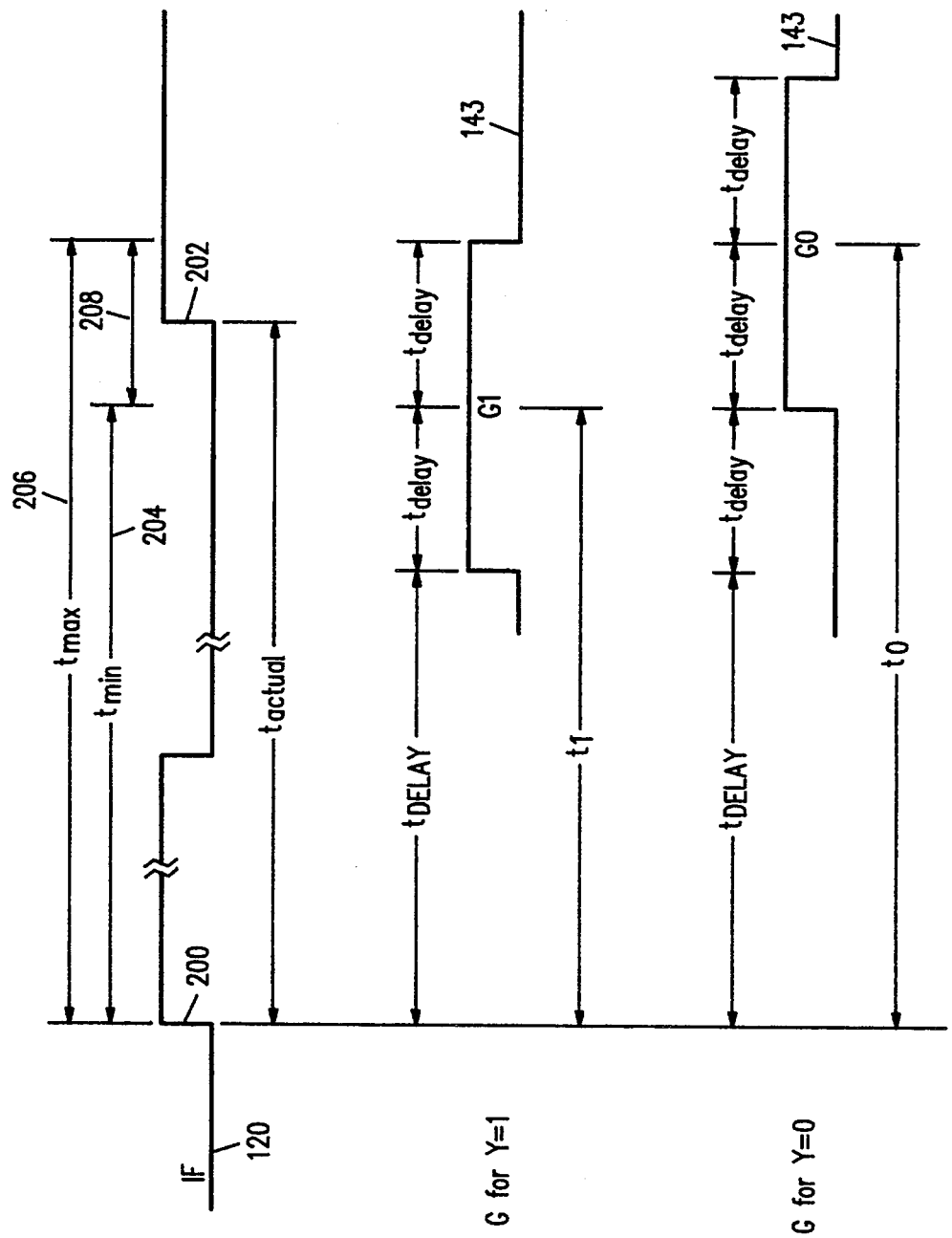
FIGS. 5 and 6 are timing diagrams illustrating operation of the sigma-delta FM digital demodulator of the present invention.

FIG. 5 illustrates the signal 143 early and late gate pulses, designated G1 and G0 in FIG. 5, relative to adjacent similar transitions in the IF signal 120. In FIG. 5, IF signal 120 is shown including a first rising edge transition 200 and a subsequent adjacent similar rising edge 202. The occurrence of rising edge 202 relative to rising edge 200 will be within a window of valid next transitions defined by a $t_{min}$ interval 204 and a $t_{max}$ interval 206. For standard FM broadcast with a 10.7 MHz IF signal, the IF signal 120 can vary in frequency between 10.6 MHz and 10.8 MHz. The valid transition window 208 corresponds to a 1.75 nS window 208 where the $t_{min}$ time interval 204 is approximately 92.59 nS and the $t_{max}$ interval 206 is approximately 94.34 nS.

Each of the gates G1 and G0 are of width corresponding to twice the delay period $t_{delay}$. This results from use of the pair of serially connected adjustable delay elements 188, each identical to element 170, in the pulse generator 184. The delay introduced by the inverter 186 can be considered negligible, or in a highly critical application can be matched by a second similar element placed in series with the pair of adjustable delay elements 188. The late gate signal G0 begins later than the gate signal G1 by a factor of delay interval $t_{delay}$ as a result of the use of delay element 170 as applied to the input of AND gate 178. While gates G1 and G0 are never produced concurrently, the overlap in time between gates G1 and G0 corresponds to the window 208. The anticipated time of next transition represented by the gate G1, i.e., the center point of gate G1, is just slightly ahead of the window 208, and the anticipated time represented by the gate G0 is just slightly after the window 208.

Figure 6:
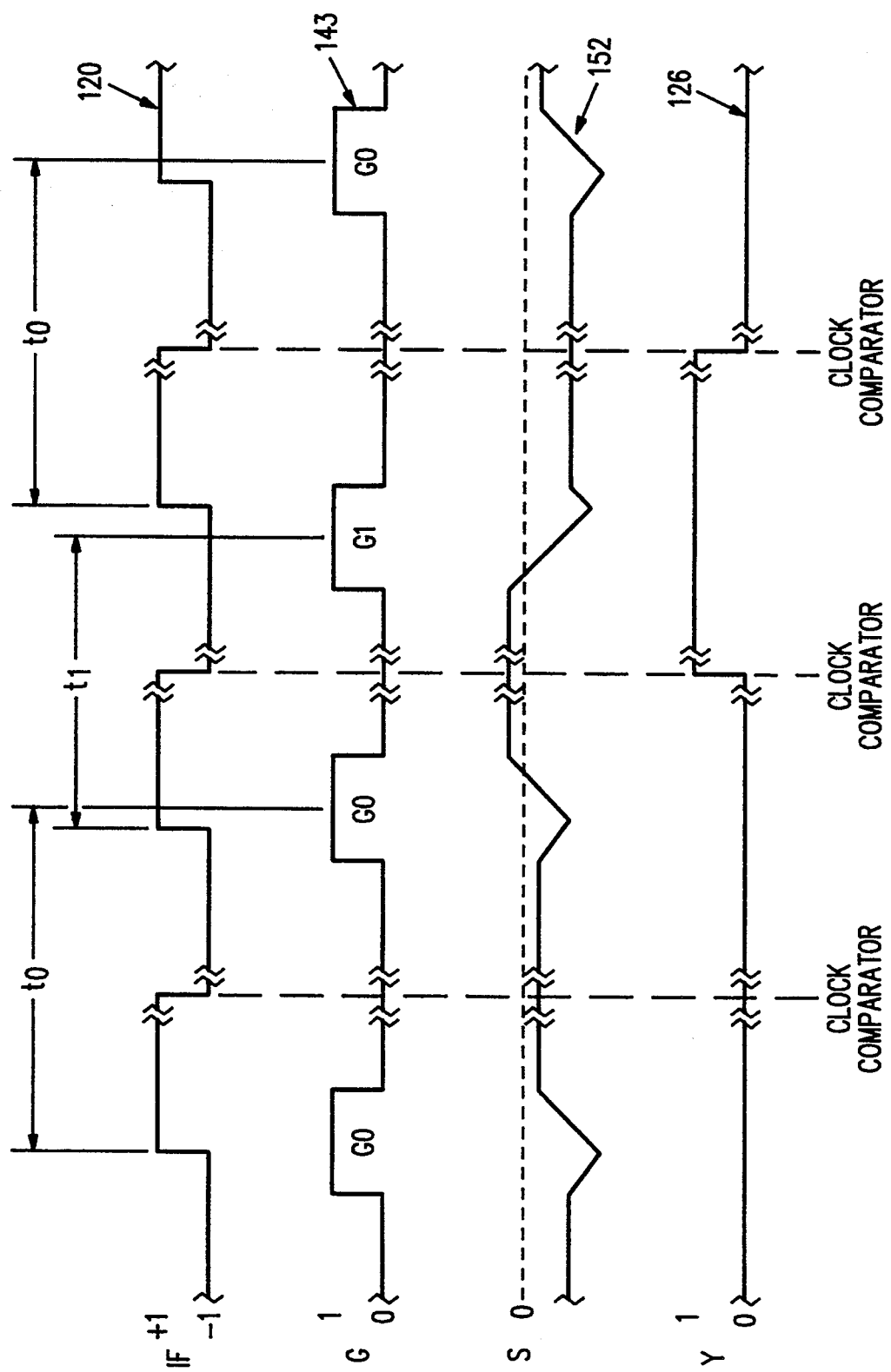

FIG. 6 illustrates various signals developed in the sigma-delta FM digital demodulator 122 for a given condition of the IF signal 120. In FIG. 6, the IF signal 120 presents a frequency wherein the next actual transition 202 (FIG. 5) occurs at a point two-thirds into the window of valid next transitions, i.e., two-thirds of the way from the time $t_1$ to the time $t_0$. Four cycles of circuit 122 operation are illustrated in FIG. 6. In the first cycle, the integrator output 152 is negative and the late gate G0 is selected for presentation in the signal 143 to the switch 144. The integrator output 152 then increases toward positive, but does not yet pass zero. Because the integrator output 152 is negative in this next cycle, the late gate G0 is again selected for application to the switch 144. In response, the integrator output 152 again moves in the positive direction, but this time passes zero and presents a positive voltage to comparator 154. In this next cycle, therefore, the early gate G1 is selected for application to the switch 144 and, in response thereto, the integrator output 152 moves in the negative direction.

In the illustrated example, the integrator output 152 barely moved into the positive region, and as a result of the application of early gate G1, returned to the negative region and caused selection in the next cycle of the late gate G0. Thus, a pattern of bit stream 126 output develops. In the purest sense, the bit stream 126 does not produce an output proportional to the frequency of the signal 120 but rather an output proportional to $t_{actual}$, the time between the chosen transitions 200 and 202 of the signal 120 (FIG. 5). By defining $t_{center}$ as the time halfway between the minimum anticipated time $t_1$ and the maximum anticipated time $t_0$, with a corresponding frequency of $freq_{center}$, and defining $t_{deviation}$ as the difference between $t_{actual}$ and $t_{center}$, a power series expansion can be made for the deviation of the frequency of signal 120 ($freq_{modulation}$), as a function of $t_{deviation}$:

$$freq_{modulation} = freq_{center}\{-(t_{deviation}/t_{center}) + (t_{deviation}/t_{center})^2 - \ldots\}$$

If $t_{deviation}$ is very much smaller than $t_{center}$, the square and higher order terms can be considered as negligible, and the deviation of the frequency of the signal 120 becomes proportional to the negative of $t_{deviation}$. If $t_{deviation}$ is not very much smaller than $t_{center}$, then a correction must be made to account for the higher order terms of the power series expansion to accurately demodulate an FM signal 120. This correction may be performed by the inclusion of a correction factor in the values stored in a look up table which is explained later.

In the example illustrated in FIG. 6, where the square and higher order terms can be considered negligible, the IF signal 120 has a frequency one-third of the way from the minimum allowed frequency to the maximum allowed frequency. This places the actual transition at two-thirds of the way into the window of valid transitions, which results in a repeating pattern of "001" appearing in the bit stream 126. This repeating pattern corresponds to a proportion of one-third, and thereby represents the frequency of IF signal 120 as being one-third of the way from the minimum allowed frequency to the maximum allowed frequency. As may be appreciated, however, more than three bits of information would normally be taken from the bit stream 126 in deriving frequency information, the particular example illustrated being of such nature that the pattern develops within three cycles of circuit operation.

Returning to FIG. 3, frequency deviation control signal 172 and center frequency control signal 166 correspond to frequency deviation control signal 23 and center frequency control signal 25 of FIG. 1. A delay control block 167 performs the algorithms used in manipulating the center frequency control signal 172 and frequency deviation control signal 166 as described above in connection with FIG. 1.

The bit stream 126 represents frequency information as a ratio of digital "one" values relative to the total number of digital "one" and "zero" values appearing in the bit stream 126. The sample clock 124 is a signal 120 frequency dependent clock providing a basis for extracting values from the bit stream 126. Thus, decimator block 128 develops the frequency data 130 by counting, during a given constant magnitude system synchronous time interval as driven by the system synchronous frequency collect signal 134, the total number of digital values "one" appearing in bit stream 126 as compared to the total number of cycles in the sample clock 124.

Figure 7:
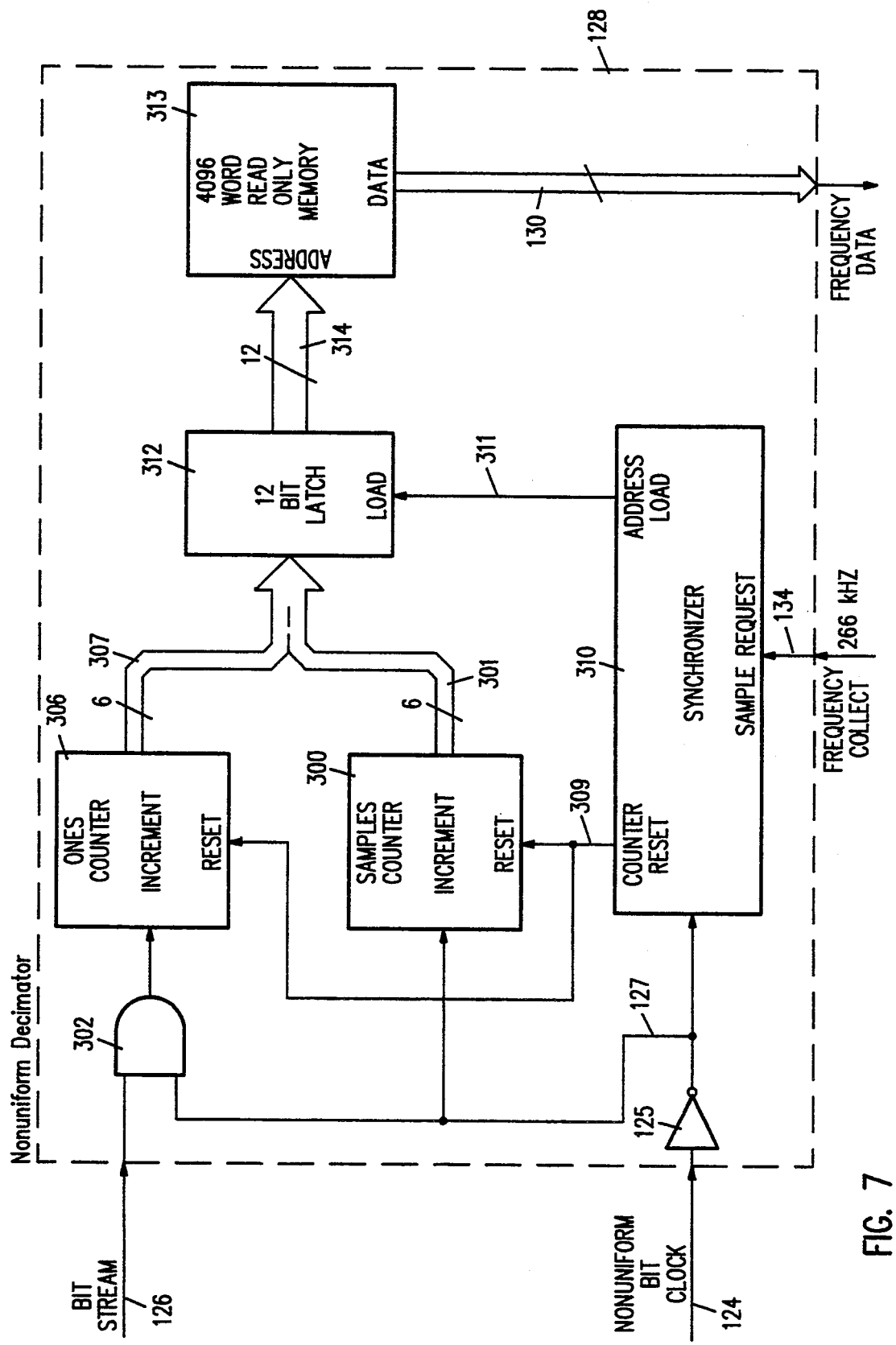
FIG. 7 is a block diagram of a decimator providing frequency information based on the output of the digital demodulator of the present invention.

FIG. 7 illustrates in more detail a preferred form of the decimator block 128. In FIG. 7, sample clock signal 124 is applied to inverter 125 producing inverted sample clock 127. Clock 127 is then applied to the increment input of a sample counter register 300. Thus, sample counter register 300 counts the number of cycles in the sample clock signal 124. The bit stream 126 is applied to a first input of an AND gate 302. The second input of the AND gate 302 receives the inverted sample clock 127. The output of AND gate 302 is applied to the increment input of a ones counter register 306. Thus, the increment input to the ones counter register 206 will cycle for each cycle in the sample clock signal 124 associated with a digital value "one" in the bit stream 126.

Each of registers 300 and 306 includes a reset input provided by a reset signal 309 of timing synchronization block 310. Timing synchronization block 310 receives the frequency collect signal 134, e.g., at 266 Khz, and the inverted sample clock signal 127. The frequency collect signal 134 is a system synchronous signal whereas the sample clock signal 124 and hence inverted sample clock 127 are system asynchronous signals, i.e., frequency dependent relative to the IF signal 120. Thus, timing synchronization block 310 resets the registers 300 and 306 in system synchronous manner and according to constant magnitude time intervals, but avoids transition conditions in bit stream 126 and clock 124.

Timing synchronization block 310 also applies an address load input 311 to a frequency look up table address latch 312. Thus, latch 312 collects the ones count 307 from register 306 and the samples count 301 from register 300 in response to the address load input 311. Frequency look up table 313 accepts as memory address data 314 the value held in latch 312 and provides as its output a corresponding frequency datum 130, e.g., a multiple bit frequency value. Thus, frequency look up table 313 should be constructed in such manner to provide a divide function relative to the data provided by registers 300 and 306. More particularly, the data stored in table 313 represents the result of the value held in ones counter register 306 divided by the value held in sample counter register 300. This division represents a number between zero and one and establishes the frequency of IF signal 120 by scaling the position of the transition 202 in the window 208 (FIG. 5).

Figure 8:
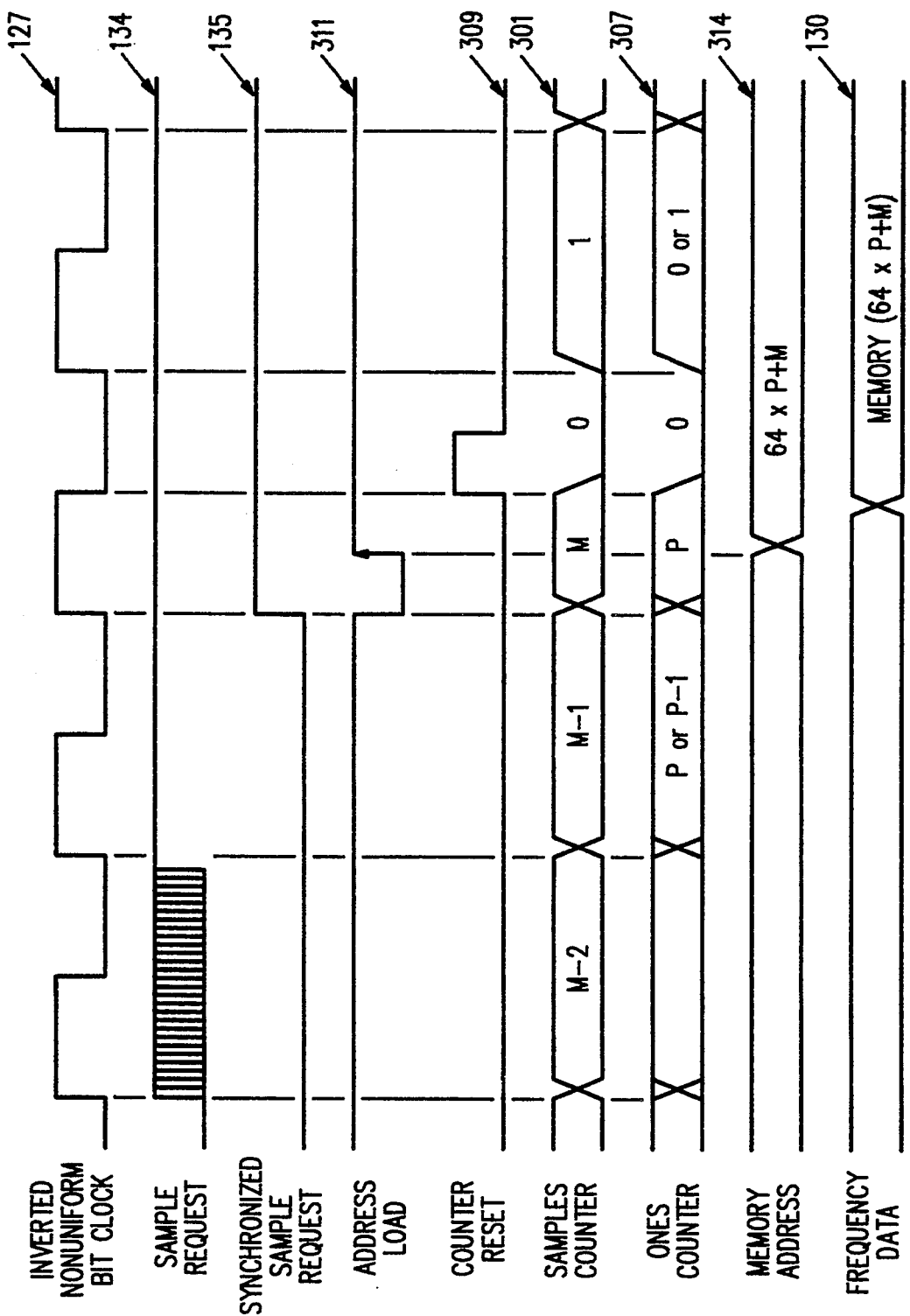
FIG. 8 is a timing diagram for the circuit of FIG. 7.

FIG. 8 illustrates various timing relationships between the signals of the circuit of FIG. 7 and should support, for one skilled in the art, implementation of the synchronizer 130. The synchronized sample request 135 is a signal generated by cascading two type D flip-flops clocked by non-uniform bit clock 127 and receiving as input the sample request 134. The variable M in FIG. 8 refers to the six bit value 301 taken from the samples register 300. The variable P refers to the six bit value 307 taken from the ones counter 306. As previously noted, the values M and P are joined to form an address applied to the look up table 313. The data stored in the corresponding address should represent a division of the variable P by the variable M. Such data could further include any correction factors considered necessary relative to circuit characteristics and especially those required to correct for the higher order terms of the power series mentioned earlier.

It will be appreciated that the present invention is not restricted to the particular embodiment that has been described and illustrated, and that variations may be made therein without departing from the scope of the invention as found in the appended claims and equivalents thereof.

For example, the sigma-delta digital FM demodulator of the present invention bears some similarity to sigma-delta analog-to-digital data convertors. Many enhancements have been developed with respect to such sigma-delta analog to digital convertors, and these enhancements can be applied to the sigma-delta FM digital demodulator of the present invention. Such enhancements include an integrator having more than one pole, i.e., a multi-pole integrator or integrators in combination with band pass filters having poles at non-zero frequencies. Such a multi-pole combination can force quantization noise away from data frequencies and thereby provide enhanced signal processing. After having the benefit of the present disclosure, and familiarity with sigma-delta analog-to-digital convertors, those skilled in the art will appreciate that other enhancements applicable to sigma-delta analog-to-digital convertors may be equally applicable to design modifications of sigma-delta digital FM demodulators in accordance with the present invention.

What is claimed is:

1. A method of digital frequency demodulation comprising the steps:
   monitoring chosen transitions of an FM signal;
   selecting, based on an accumulated error value, one of a plurality of anticipated times between adjacent chosen signal transitions;
   measuring a time difference between an actual next transition time and the selected anticipated transition time; and
   incorporating said difference into said accumulated error value.

2. A method according to claim 1 wherein said chosen transitions are sequentially adjacent similar transitions in said FM signal.

3. A method according to claim 1 wherein said selecting step comprises delaying a first of said chosen transitions in said FM signal to provide a plurality of trigger signals relatively offset in time and occurring in given proximity by virtue of said delaying step to a next one of said similar transitions in said FM signal, one of said trigger signals being selected as a function of said accumulated error value, the selected one of said trigger signals corresponding to a selected anticipated time.

4. A method according to claim 1 wherein said selected anticipated time is a gate signal having a given state of given duration, the selected anticipated time corresponding to a mid-point of said given duration, and said measuring step comprises integration during said given duration of a frequency signal derived from said FM signal and having a first condition preceding each similar transition and a second condition following each similar transition.

5. A method according to claim 4 wherein said first condition is a positive voltage and said second condition is a negative voltage whereby integration of said frequency signal during said given duration provides a measure of said time difference as a net change in an integrator output over said given duration and said integrator represents said accumulated error value.

6. A method of frequency demodulation comprising the steps:
   receiving a frequency modulated signal;
   indicating time of occurrence for chosen transitions in said frequency modulated signal;
   generating an anticipated time of occurrence for each of said chosen transitions, said generation of an anticipated time of occurrence being a function of an accumulated error value;
   measuring a cycle error for each of said anticipated times of occurrence relative to the corresponding times of occurrence;
   incorporating said cycle errors into said accumulated error value; and
   deriving a frequency of said frequency modulated signal as a function of a selected series of said anticipated times of occurrence.

7. A method according to claim 6 wherein said generating step comprises selecting from a set of available anticipated times of occurrence.

8. A method according to claim 7 wherein said set of available anticipated times of occurrence are a function of a delayed prior chosen transition in said FM signal.

9. A method according to claim 6 wherein said generating step comprises selecting from a set of available anticipated times of occurrence within a window of valid times of occurrence, and said deriving step comprises averaging of values taken from said series of anticipated times of occurrence for each pending one of said similar transitions.

10. A method according to claim 6 wherein said generating step comprises selection of anticipated times of occurrence in negative feedback fashion to maintain said accumulated error value within a given magnitude.

11. A device producing a representation of frequency of a signal, the device comprising:
   means receiving a frequency signal and indicating times of occurrence of given chosen conditions in said frequency signal, the relative time of occurrence among said given chosen conditions representing frequency of said frequency signal;
   means generating anticipated times of occurrence for said given chosen conditions;
   means comparing an indication of time of occurrence for said given chosen condition with the associated anticipated time of occurrence and producing a representation of error in the anticipated time of occurrence relative to the indicated time of occurrence; and
   means collecting from said comparing means said representation of error and incorporating said errors into an accumulated error, said generating means selecting each anticipated time of occurrence as a function of said accumulated error.

12. A device according to claim 11 wherein said given chosen conditions are similar transitions in said frequency signal.

13. A device according to claim 12 wherein said similar transitions are rising transitions.

14. A device according to claim 12 wherein said similar transitions are falling transitions.

15. A device according to claim 11 wherein said given chosen conditions are sequentially adjacent in time.

16. A device according to claim 11 wherein said generating means comprises a gate signal generator triggered in delayed fashion relative to a preceding occurrence of said chosen condition, said gate signal having a given state of given duration, the associated anticipated time of occurrence corresponding to a mid-point of said given duration.

17. A device according to claim 11 wherein said generating means comprises a gate signal generator triggered in delayed fashion relative to a preceding occurrence of said chosen condition, said gate signal being a signal of a given state for a given duration, the associated anticipated time of occurrence of said gate signal corresponding to a mid-point of said given duration; and said comparing means measures a first time interval beginning with said given state of said gate signal and ending with indication of occurrence of said given chosen condition in said frequency signal and measures a second time interval beginning indication of said given chosen condition in said frequency signal and terminating with said given state of said gate signal, said representation of error being a representation of a time difference between said first and second time intervals.

18. A device according to claim 11 wherein said receiving means indicates time of occurrence for each of said given chosen conditions by transition from a first state to a second state, said generating means produces as an anticipated time of occurrence a gate signal of given duration with the time of anticipated occurrence corresponding to a mid-point of said given duration, said comparing means identifies first and second time intervals of said given duration corresponding to said frequency signal being in said first and second states, respectively, during said given duration and represents said error as a difference between said first and second time intervals.

* * * * *